United States Patent
Tawara (10) Patent No.: US 11,201,218 B2
(45) Date of Patent: Dec. 14, 2021

(54) SILICON CARBIDE EPITAXIAL SUBSTRATE, METHOD OF MANUFACTURING THEREOF, SILICON CARBIDE SEMICONDUCTOR DEVICE, AND METHOD OF MANUFACTURING THEREOF

(71) Applicant: FUJI ELECTRIC CO., LTD., Kawasaki (JP)

(72) Inventor: Takeshi Tawara, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 65 days.

(21) Appl. No.: 16/814,554

(22) Filed: Mar. 10, 2020

(65) Prior Publication Data
US 2020/0312966 A1 Oct. 1, 2020

(30) Foreign Application Priority Data
Mar. 27, 2019 (JP) .............................. JP2019-061968

(51) Int. Cl.
| | |
|---|---|
| *H01L 29/36* | (2006.01) |
| *H01L 29/16* | (2006.01) |
| *H01L 29/868* | (2006.01) |
| *H01L 29/78* | (2006.01) |
| *H01L 29/66* | (2006.01) |
| *H01L 21/04* | (2006.01) |

(52) U.S. Cl.
CPC ............ *H01L 29/36* (2013.01); *H01L 21/046* (2013.01); *H01L 29/1608* (2013.01); *H01L 29/6606* (2013.01); *H01L 29/66068* (2013.01); *H01L 29/7813* (2013.01); *H01L 29/868* (2013.01)

(58) Field of Classification Search
CPC ... H01L 29/36; H01L 29/1608; H01L 29/868; H01L 29/66068; H01L 21/046; H01L 29/6606; H01L 29/7813; H01L 21/02576; H01L 21/02658; H01L 21/02529; H01L 21/02378; H01L 21/26506; H01L 29/0623; H01L 29/1095; H01L 29/167; H01L 29/861
See application file for complete search history.

(56) References Cited

U.S. PATENT DOCUMENTS 7,138,668 B2 * 11/2006 Hayashi ................ H01L 21/046
257/183

* cited by examiner

*Primary Examiner* — David Vu
(74) *Attorney, Agent, or Firm* — Rabin & Berdo, P.C.

(57) ABSTRACT

A silicon carbide epitaxial substrate including a silicon carbide semiconductor substrate of a first conductivity type, a first semiconductor layer of the first conductivity type, and a high-density foreign element region. The first semiconductor layer is provided at a front surface of the silicon carbide semiconductor substrate and has an impurity concentration lower than that of the silicon carbide semiconductor substrate. The high-density foreign element region is provided in the silicon carbide semiconductor substrate at a predetermined depth from the front surface thereof. The high-density foreign element region contains an element other than carbon and silicon, at a density higher than that of the silicon carbide semiconductor substrate.

9 Claims, 9 Drawing Sheets

NORMAL TEMPERATURE RISE

FIG.6

900°C ANNEALING FOR 60 MINUTES

FIG.7 total BPD

FIG.8

AREAS OF INCREASED
PENETRATING BPDs (+2 OR MORE)
DUE TO ANNEALING AT 1250 [°C]
FOR 30 [min] DURING
TEMPERATURE RISE

SILICON CARBIDE EPITAXIAL SUBSTRATE, METHOD OF MANUFACTURING THEREOF, SILICON CARBIDE SEMICONDUCTOR DEVICE, AND METHOD OF MANUFACTURING THEREOF

TECHNICAL FIELD

The present invention relates to a silicon carbide epitaxial substrate, a method of manufacturing a silicon carbide epitaxial substrate, a silicon carbide semiconductor device, and a method of manufacturing a silicon carbide semiconductor device.

BACKGROUND ART

Conventional silicon (Si) single crystals are used as a material of power semiconductor devices that control high voltage and/or large current. At present, there are several types of silicon power semiconductor devices and these devices are selectively used according to an intended purpose. For example, P-intrinsic-N diodes (PiN diodes), bipolar transistors, and insulated gate bipolar transistors (IGBTs) are so-called bipolar-type devices. These devices have high current density but cannot perform high-speed switching; the limit of switching frequency is about several kHz for bipolar transistors and about several tens of kHz for IGBTs. On the other hand, power metal oxide semiconductor field effect transistors (MOSFETs) cannot accommodate large current but can be used at high speeds up to several MHz. Nonetheless, there is strong demand in the market for power devices that combine large current and high speeds; silicon IGBTs, power MOSFETs and the like have been intensively developed and improved, and at present, have substantially reached the theoretical limit determined by the silicon material.

Materials have also been studied from the perspective of power semiconductor devices and silicon carbide (SiC) has particularly gained attention recently for next-generation power semiconductor devices because these are devices that excel regarding low ON voltage, high-speed characteristics, and high-temperature characteristics. This is because SiC is chemically a very stable material, has a wide bandgap of 3 eV, can be used very stably as a semiconductor even at high temperatures, and has a critical field strength that is at least ten times greater than that of silicon. SiC is likely to exceed the material limits of silicon and therefore, further growth is greatly expected for power semiconductor applications.

Figure 14:
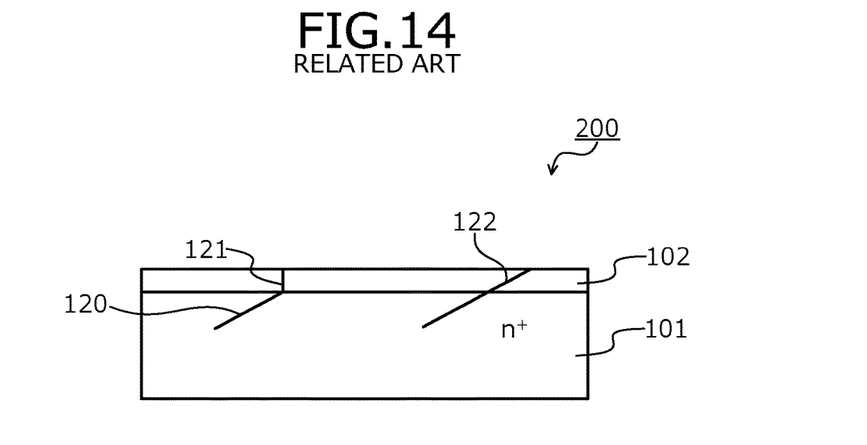
FIG. 14 is a cross-sectional view depicting a structure of the conventional silicon carbide epitaxial substrate.

FIG. 14 is a cross-sectional view depicting a structure of a conventional silicon carbide epitaxial substrate. In a conventional silicon carbide semiconductor device, a silicon carbide epitaxial substrate 200 that has an n-type silicon carbide epitaxial layer 102 grown epitaxially on a front surface of an n$^+$-type silicon carbide substrate 101 that contains single crystal 4H—SiC (4-layer periodic hexagonal crystal of silicon carbide) is used. The n-type silicon carbide epitaxial layer 102 is formed by epitaxial growth and therefore, with high purity, dopant concentration and film thickness can be controlled to be a desired value. In the n-type silicon carbide epitaxial layer 102, a device structure such as a SBD, a MOSFET, an IGBT, and a PiN diode is used. In the silicon carbide epitaxial substrate, crystal defects such as basal plane dislocations (BPDs) 120, 122 and threading edge dislocations (TEDs) 121 are present.

SUMMARY OF THE INVENTION

Problem to be Solved by the Invention

Figure 15:
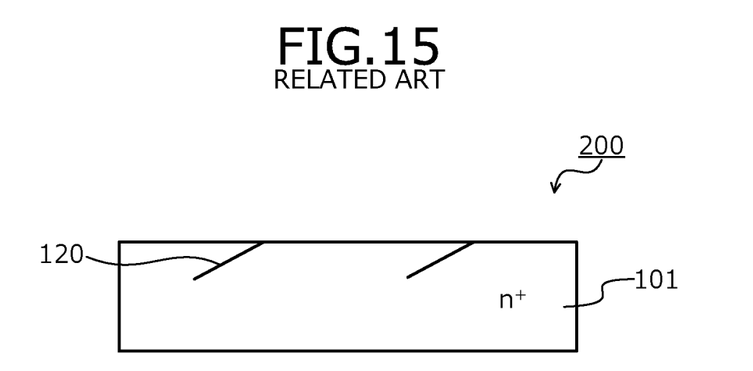
FIG. 15 is a cross-sectional view depicting the structure of a conventional silicon carbide substrate.

FIG. 15 is a cross-sectional view depicting a structure of a conventional silicon carbide substrate. As depicted in FIG. 15, in the n$^+$-type silicon carbide substrate 101, defects called the basal plane dislocations 120 are contained at a density on an order of $10^2$ to $10^3/cm^2$. While most of the basal plane dislocations 120 are converted into the threading edge dislocations 121 when the n-type silicon carbide epitaxial layer 102 is epitaxially grown, some become penetrating BPDs 122 that penetrate the n-type silicon carbide epitaxial layer 102 (refer to FIG. 14).

When the penetrating BPDs 122 are present in the n-type silicon carbide epitaxial layer 102 and a device such as a MOSFET, an IGBT, a PiN diode, or the like is subject to bipolar operation, triangular-shaped stacking faults (SFs) expand from the penetrating BPDs 122 in the n-type silicon carbide epitaxial layer 102. The stacking faults are resistance components and therefore, forward ON voltage in a device such as a MOSFET, an IGBT, a PiN diode, or the like increases.

To solve the problems of the conventional techniques described above, one object of the present invention is to provide a silicon carbide epitaxial substrate, a method of manufacturing a silicon carbide epitaxial substrate, a silicon carbide semiconductor device, and a method of manufacturing a silicon carbide semiconductor device that reduce the conversion of BPDs into penetrating BPDs.

Means for Solving Problem

To solve the problems described above and achieve an object, a silicon carbide epitaxial substrate according to the present invention has: a first semiconductor layer of a first conductivity type, provided at a front surface of a silicon carbide semiconductor substrate of the first conductivity type and having an impurity concentration lower than that of the silicon carbide semiconductor substrate; and a high-density foreign element region provided at a predetermined depth from the front surface of the silicon carbide semiconductor substrate and containing a foreign element other than carbon and silicon at a density higher than that of the silicon carbide semiconductor substrate.

Further, in the silicon carbide epitaxial substrate according to the present invention, a thickness of the high-density foreign element region is 0.1 μm to 1.0 μm.

Further, in the silicon carbide epitaxial substrate according to the present invention, the density of the foreign element in the high-density foreign element region is $1\times10^{14}/cm^3$ to $1\times10^{18}/cm^3$.

To solve the problems described above and achieve an object, a silicon carbide semiconductor device according to the present invention has: a high-density foreign element region provided at a predetermined depth from a front surface of a silicon carbide semiconductor substrate of a first conductivity type, the high-density foreign element region containing a foreign element at a density higher than that of the silicon carbide semiconductor substrate; a first semiconductor layer of the first conductivity type provided at the front surface of the silicon carbide semiconductor substrate and having an impurity concentration lower than that of the silicon carbide semiconductor substrate; a second semiconductor layer of a second conductivity type provided at a surface of the first semiconductor layer, opposite to a surface thereof facing the silicon carbide semiconductor substrate; a first electrode provided at a surface of the second semiconductor layer; and a second electrode is provided at a back surface of the silicon carbide semiconductor substrate.

To solve the problems described above and achieve an object, a method of manufacturing a silicon carbide epitaxial substrate according to the present invention includes: ion implanting a foreign element at a front surface of a silicon carbide semiconductor substrate of a first conductivity type, the foreign element being ion implanted at a depth of at least 0.1 µm; and forming, at the front surface of the silicon carbide semiconductor substrate, a first semiconductor layer of the first conductivity type by epitaxial growth, the first semiconductor layer having an impurity concentration lower than that of the silicon carbide semiconductor substrate.

Further, in the method of manufacturing the silicon carbide epitaxial substrate according to the present invention, the foreign element is hydrogen, magnesium, calcium, scandium, titanium, vanadium, chromium, manganese, or iron.

To solve the problems described above and achieve an object, a method of manufacturing a silicon carbide semiconductor device according to the present invention includes: irradiating a front surface of a silicon carbide semiconductor substrate of a first conductivity type with a foreign element to a depth of at least 0.1 µm; forming at the front surface of the silicon carbide semiconductor substrate, a first semiconductor layer of a first conductivity type by epitaxial growth, the first semiconductor layer having an impurity concentration lower than that of the silicon carbide semiconductor substrate; forming a second semiconductor layer of the first conductivity type at a surface of the first semiconductor layer, opposite to a surface thereof facing the silicon carbide semiconductor substrate; forming a third semiconductor layer of a second conductivity type at a surface of the second semiconductor layer, opposite to a surface thereof facing the silicon carbide semiconductor substrate; forming a first electrode at a surface of the third semiconductor layer; and forming a second electrode at a back surface of the silicon carbide semiconductor substrate.

According to the invention described above, a silicon carbide epitaxial substrate has in an n⁺-type silicon carbide substrate, a region containing a foreign element at a high density. The foreign element becomes an obstacle when dislocations move and inhibits movement of the dislocations, whereby even when thermal stress is applied, crystal defects among BPDs do not expand, the BPDs become easily converted into TEDs, and the conversion efficiency of BPDs is enhanced.

Effect of the Invention

The silicon carbide epitaxial substrate, the method of manufacturing a silicon carbide epitaxial substrate, the silicon carbide semiconductor device, and the method of manufacturing a silicon carbide semiconductor device according to the present invention achieve an effect in that conversion of BPDs into penetrating BPDs is reduced.

MODE OF CARRYING OUT THE INVENTION

Preferred embodiments of a silicon carbide epitaxial substrate, a method of manufacturing a silicon carbide epitaxial substrate, a silicon carbide semiconductor device, and a method of manufacturing a silicon carbide semiconductor device according to the present invention will be described in detail with reference to the accompanying drawings. In the present description and accompanying drawings, layers and regions prefixed with n or p mean that majority carriers are electrons or holes, respectively. Additionally, + or − appended to n or p means that the impurity concentration is higher or lower, respectively, than layers and regions without + or −. Cases where n or p symbols include the same + or − indicate that concentrations are close and the concentrations are not necessarily equal. In the description of the embodiments below and the accompanying drawings, main portions that are identical will be given the same reference numerals and will not be repeatedly described.

Embodiment

Figure 1:
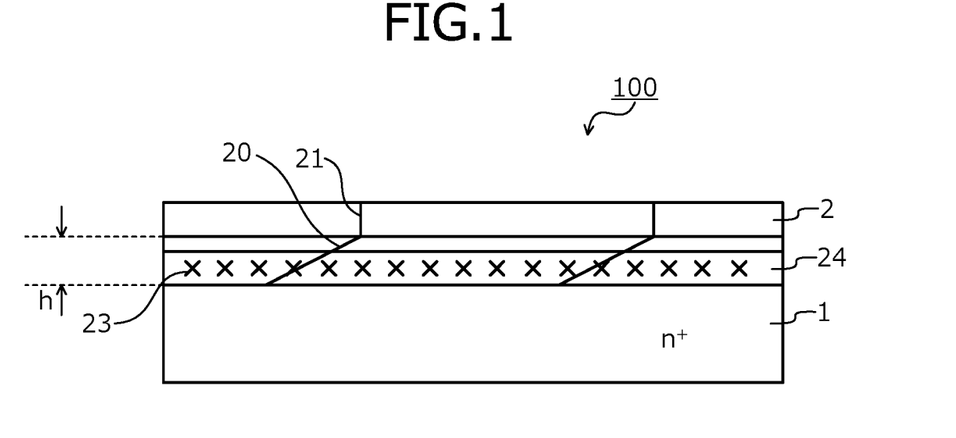
FIG. 1 is a cross-sectional view depicting a structure of a silicon carbide epitaxial substrate according to an embodiment.

Among a silicon carbide epitaxial substrate, a method of manufacturing a silicon carbide epitaxial substrate, a silicon carbide semiconductor device, and a method of manufacturing a silicon carbide semiconductor device according to the present invention, first, the silicon carbide epitaxial substrate will be described. FIG. 1 is a cross-sectional view depicting a structure of a silicon carbide epitaxial substrate according to an embodiment.

As depicted in FIG. 1, a silicon carbide epitaxial substrate 100 includes an $n^+$-type silicon carbide substrate 1 and an n-type silicon carbide epitaxial layer 2. The n-type silicon carbide epitaxial layer 2 is provided at a front surface of the $n^+$-type silicon carbide substrate 1 and is a semiconductor layer that is formed by epitaxial growth and has an impurity concentration lower than that of the $n^+$-type silicon carbide substrate 1.

In the $n^+$-type silicon carbide substrate 1, a high-density foreign element region 24 is provided at a predetermined depth from the front surface of the $n^+$-type silicon carbide substrate 1. The high-density foreign element region 24 is a region in which a density of a foreign element 23 is higher than that in the $n^+$-type silicon carbide substrate 1. The high-density foreign element region 24, for example, has a film thickness h that is preferably 0.1 μm to 1 μm.

Because the foreign element 23 in the high-density foreign element region 24 hinders movement of basal plane dislocations 20, the silicon carbide epitaxial substrate 100 of the embodiment increases the proportion of the basal plane dislocations 20 in the $n^+$-type silicon carbide substrate 1 converted into threading edge dislocations 21, reduces the proportion thereof converted into penetrating basal plane dislocations, and improves BPD conversion efficiency. The BPD conversion efficiency is the proportion of the basal plane dislocations 20 that are converted into the threading edge dislocations 21 and as the BPD conversion efficiency increases, the basal plane dislocations 20 converted into the threading edge dislocations 21 increases; as a result, the number thereof converted into penetrating basal plane dislocations decreases, triangular-shaped stacking faults also decrease, and increases in the forward ON voltage can be reduced.

As the density of the foreign element 23 increases, the effect of hindering the movement of the basal plane dislocations 20 increases, however, when introduced excessively, defects of the n-type silicon carbide epitaxial layer 2 deposited thereon increase and therefore, the density is preferably $1 \times 10^{14}/cm^3$ to $1 \times 10^{18}/cm^3$.

Figure 2:
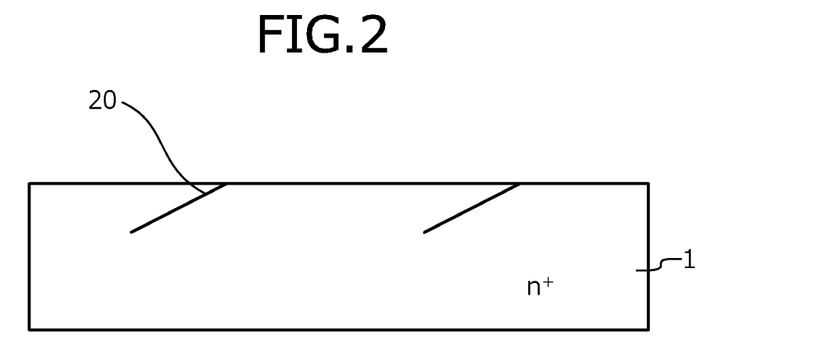
FIG. 2 is a cross-sectional view schematically depicting a state of the silicon carbide epitaxial substrate according to the embodiment during manufacture (part 1).
Figure 3:
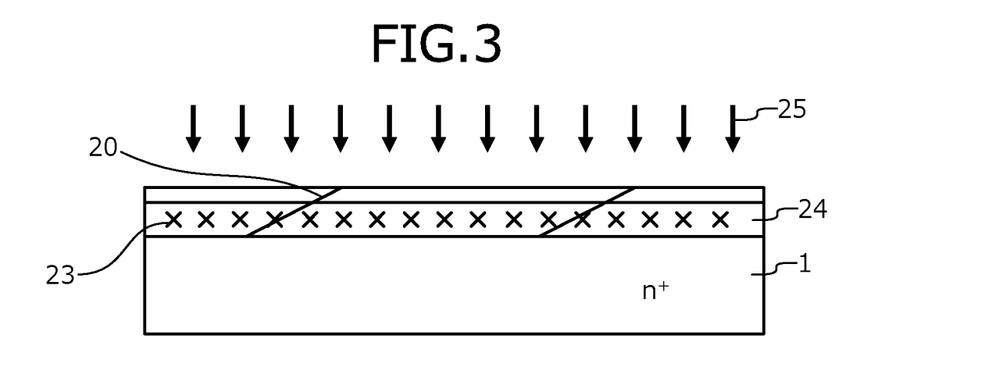
FIG. 3 is a cross-sectional view schematically depicting a state of the silicon carbide epitaxial substrate according to the embodiment during manufacture (part 2).

The silicon carbide epitaxial substrate according to the embodiment is manufactured as follows. FIGS. 2 and 3 are cross-sectional views schematically depicting states of the silicon carbide epitaxial substrate according to the embodiment during manufacture. First, the $n^+$-type silicon carbide substrate 1 is prepared. In the $n^+$-type silicon carbide substrate 1, defects called the basal plane dislocations 20 are contained at a density on an order of $10^2$ to $10^3/cm^2$. The state up to here is depicted in FIG. 2.

Next, a foreign element 25 is ion implanted from the front surface of the $n^+$-type silicon carbide substrate 1, whereby the foreign element 23 in SiC crystals is introduced and the high-density foreign element region 24 is formed. For example, hydrogen, magnesium, calcium, scandium, titanium, vanadium, chromium, manganese, iron, etc. can be used for the foreign element 25. Preferably, the size of the foreign element 25 greatly differs from that of silicon atoms and that of carbon atoms constituting the silicon carbide. Further, preferably, ion implantation of the foreign element 25 is performed so that the foreign element is implanted to a depth of at least 0.1 μm from the front surface of the $n^+$-type silicon carbide substrate 1 so as not to be removed by etching before epitaxial growth of the n-type silicon carbide epitaxial layer 2. The state up to here is depicted in FIG. 3.

Next, on the $n^+$-type silicon carbide substrate 1, a silicon carbide epitaxial layer that becomes the n-type silicon carbide epitaxial layer 2 is deposited while nitrogen (N), which is an n-type impurity, is doped. A surface on which the n-type silicon carbide epitaxial layer 2 is deposited may be a Si-face, a C-face, or a face other than these, however in the embodiment, a Si-face is used. As described above, the silicon carbide epitaxial substrate 100 of the embodiment depicted in FIG. 1 is manufactured.

Figure 4A:
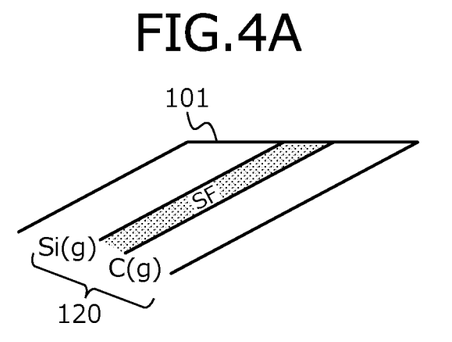
FIG. 4A is a diagram depicting penetrating BPD conversion in a conventional silicon carbide epitaxial substrate.
Figure 4B:
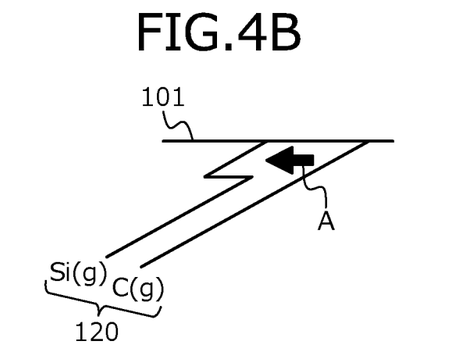
FIG. 4B is a diagram depicting penetrating BPD conversion in the conventional silicon carbide epitaxial substrate.
Figure 4C:
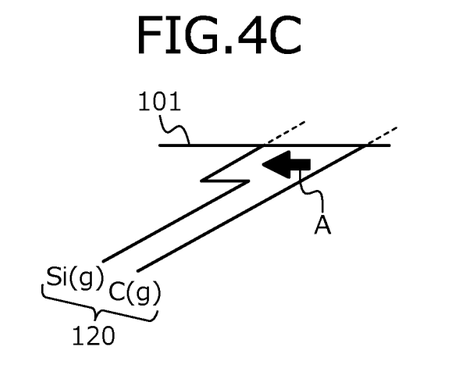
FIG. 4C is a diagram depicting penetrating BPD conversion in the conventional silicon carbide epitaxial substrate.
Figure 4D:
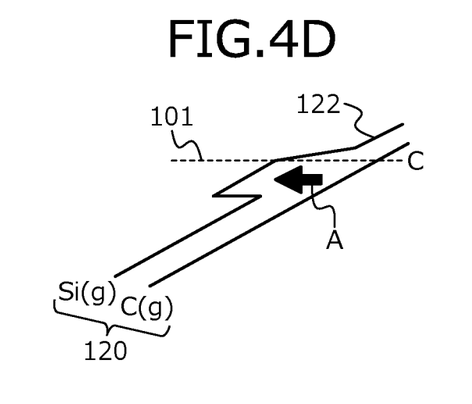
FIG. 4D is a diagram depicting penetrating BPD conversion in the conventional silicon carbide epitaxial substrate.

Next, a model of BPD penetration proposed by the inventors will be described in detail. FIGS. 4A, 4B, 4C, and 4D are diagrams depicting penetrating BPD conversion in the conventional silicon carbide epitaxial substrate. FIGS. 4A, 4B, 4C, and 4D are cross-sectional views of the silicon carbide epitaxial substrate 200. As depicted in FIG. 4A, near a surface of the $n^+$-type silicon carbide substrate 101, the BPD 120 formed by a narrow stacking fault (hatched portion in FIG. 4A) between two partial dislocations (Si(g)) and (C(g)) is present. Next, as depicted in FIG. 4B, when thermal stress is applied before the epitaxial growth of the n-type silicon carbide epitaxial layer 2, of the partial dislocations in the BPD 120, a Si-core partial dislocation Si(g) moves in a direction of arrow A and the stacking fault expands. Next, as depicted in FIG. 4C, when the front surface is hydrogen etched while the thermal stress is applied, the surface is removed by the hydrogen etching, however, at the same time, therebelow, the stacking fault expands in the direction of arrow A. Next, as depicted in FIG. 4D, an n-type silicon carbide epitaxial layer (not depicted) is epitaxially grown. In FIG. 4D, dotted line C indicates an interface between the $n^+$-type silicon carbide substrate 101 and the n-type silicon carbide epitaxial layer. As depicted in FIG. 4D, while the stacking fault slightly contracts due to a start of the epitaxial growth, the stacking fault does not completely contract and becomes the penetrating BPD 122. On the other hand, when the stacking fault sufficiently contracts, during the epitaxial growth, cross-slip of the partial dislocations and conversion into a TED occurs.

Figure 5:
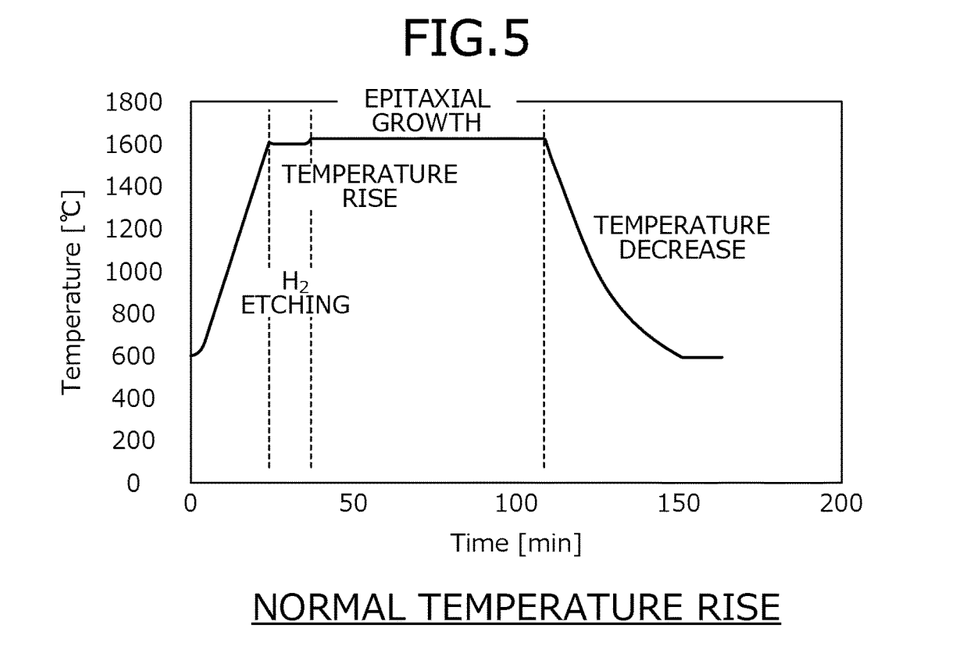
FIG. 5 is a graph depicting a temperature profile of an epitaxial growth furnace for normal temperature rise.
Figure 6:
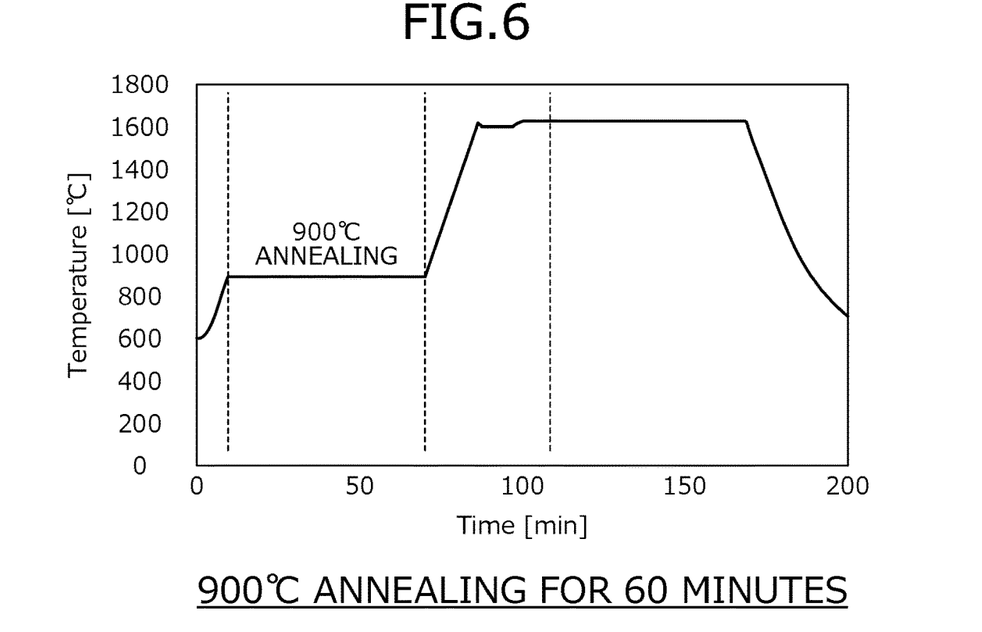
FIG. 6 is a graph depicting, for the epitaxial growth furnace, a temperature profile having an annealing time.

To verify the model, the inventors investigated the extent to which BPDs penetrate due to thermal stress. Thermal stress was given by temperature distribution of an epitaxial growth furnace. The inventors applied the thermal stress and compared penetrating BPD counts by providing an annealing time that kept the temperature constant during temperature rise of the epitaxial growth. FIG. 5 is a graph depicting a temperature profile of the epitaxial growth furnace for normal temperature rise and FIG. 6 is a graph depicting a temperature profile of the epitaxial growth furnace having the annealing time. In FIGS. 5 and 6, vertical axes indicate time in units of minutes. Further, vertical axes indicate temperature in units of degrees C.

FIG. 5 is a temperature profile when the n-type silicon carbide epitaxial layer 2 is epitaxially grown. As depicted in FIG. 5, the $n^+$-type silicon carbide substrate 1 is inserted into the epitaxial growth furnace, the temperature is raised to 1600 degrees C., and after the hydrogen ($H_2$) etching is performed, the n-type silicon carbide epitaxial layer 2 is epitaxially grown and thereafter, the temperature is lowered.

FIG. 6 is a temperature profile having the annealing time before the epitaxial growth. As depicted in FIG. 6, the $n^+$-type silicon carbide substrate 1 is inserted into the epitaxial growth furnace, the temperature is raised to 900 degrees C., and annealing is performed for 60 minutes. Thereafter, similarly as with FIG. 5, the $n^+$-type silicon carbide substrate 1 is inserted into the epitaxial growth furnace, the temperature is raised to 1600 degrees C., and after the hydrogen ($H_2$) etching is performed, the n-type silicon carbide epitaxial layer 2 is epitaxially grown and thereafter, the temperature is lowered.

Figure 7:
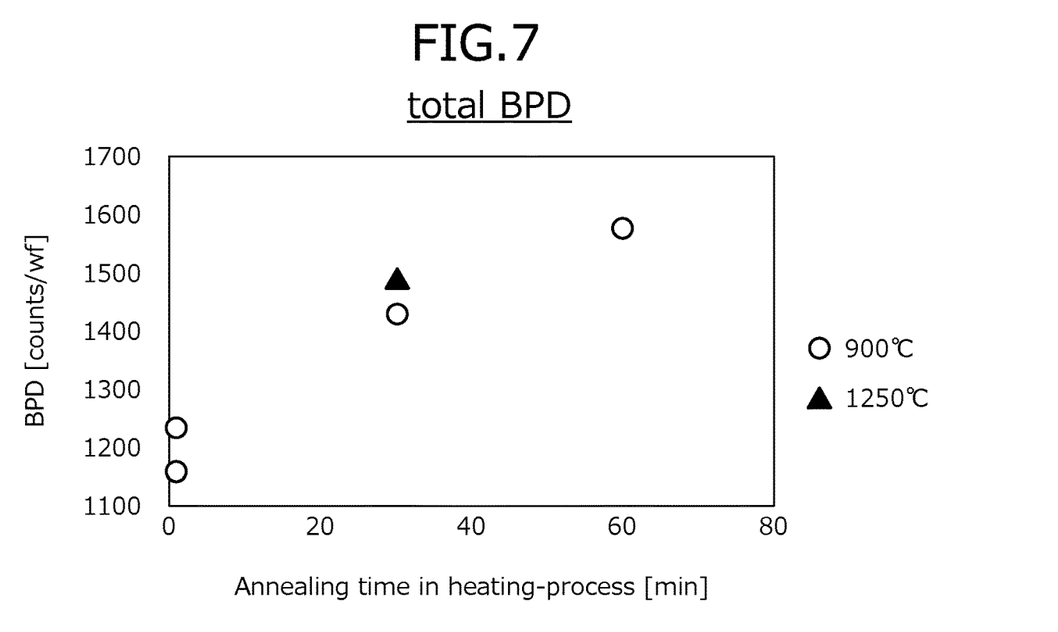
FIG. 7 is a graph depicting a relationship between annealing time and penetrating BPD count.

FIG. 7 is a graph depicting a relationship between annealing time obtained by experiment and penetrating BPD count. In FIG. 7, a horizontal axis indicates annealing time in units of minutes. Further, a vertical axis indicates counts of penetrating BPDs per semiconductor wafer in units of pieces. FIG. 7 depicts the penetrating BPD count in a case in which the time and the temperature of the annealing time is changed before epitaxial growth. As depicted in FIG. 7, as the annealing time increases, i.e., the longer thermal stress due to the annealing is applied, the count of the penetrating BPDs per semiconductor wafer increases.

Figure 8:
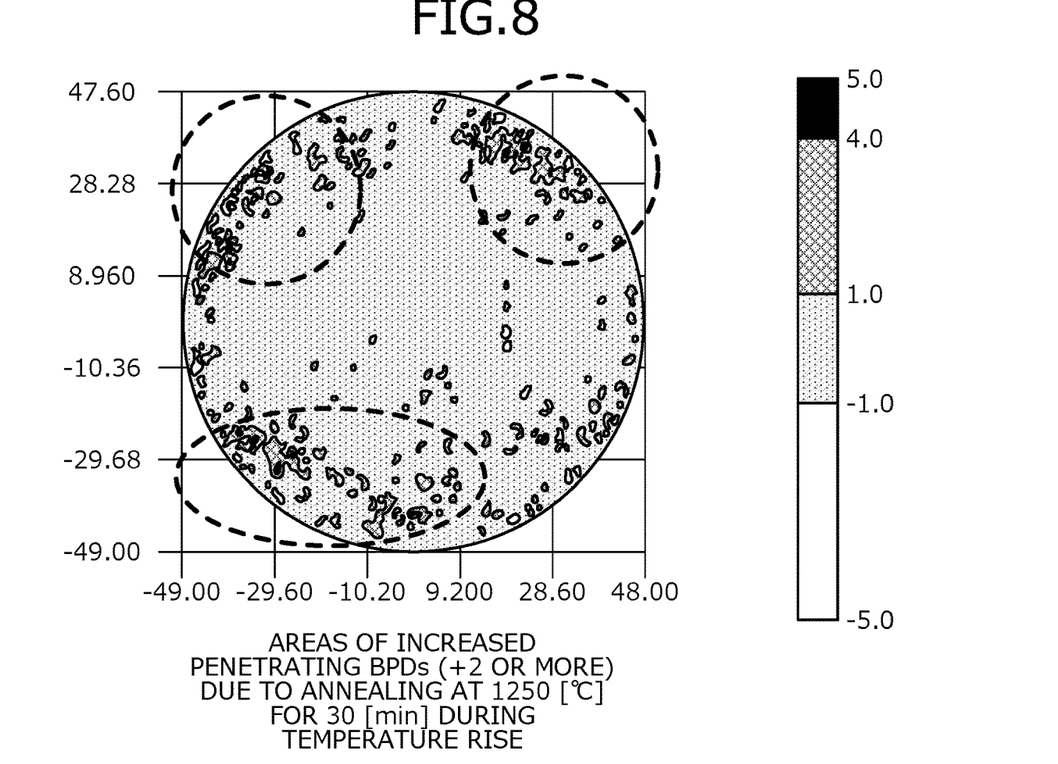
FIG. 8 is a top view of a silicon carbide semiconductor substrate, depicting areas of increased penetrating BPDs.

The inventors further investigated areas of increased penetrating BPDs at the wafer surface. FIG. 8 is a top view of silicon carbide semiconductor substrate, depicting areas of increased penetrating BPDs. FIG. 8 depicts areas where, as compared to a silicon carbide semiconductor substrate for which annealing during temperature rise was not performed, the penetrating BPDs increased by two or more penetrating BPDs within a rectangular shape having a mathematical area of 1×1.4 $mm^2$ in a silicon carbide semiconductor substrate in a case in which annealing during temperature rise was performed at 1250 degrees C. for 30 minutes. In FIG. 8, as compared to the case in which annealing is not performed during temperature rise, the areas where the penetrating BPDs increase by two or more penetrating BPDs are concentrated at parts surrounded by circles.

The inventors compared distribution (not depicted) of thermal stress calculated by the temperature distribution at the wafer surface and FIG. 8, and learned that the areas where the penetrating BPDs increased are areas having strong shear stress (thermal stress). From results of the experiment above, the inventors verified for the proposed model, that the longer thermal stress due to annealing is applied, the count of penetrating BPDs per semiconductor wafer increases.

Subsequently, the inventors proposed the following penetrating BPD reduction scheme, based on the model. In other words, for example, even when thermal stress is added, partial dislocations do not move, whereby expansion of stacking faults is suppressed and the penetrating BPD count is reduced. Movement of the partial dislocations is hindered and therefore, ion implantation of hydrogen, magnesium, calcium, scandium, titanium, vanadium, chromium, manganese, iron, etc. is performed and the high-density foreign element region 24 is formed in the $n^+$-type silicon carbide substrate 1. As is well known in metal engineering, dislocation glide motion is suppressed by a solid solution strengthening mechanism due to the foreign element. The greater that the size differs from that of the target element, the foreign element can more firmly suppress the motion.

Figure 9A:
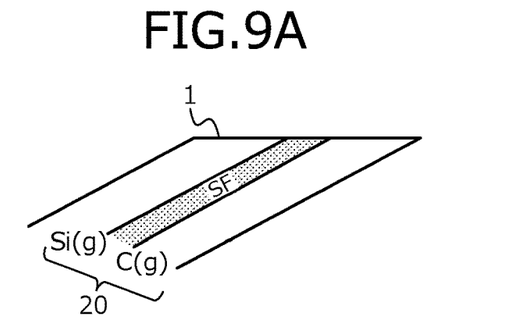
FIG. 9A is a diagram depicting TED conversion in the silicon carbide epitaxial substrate according to the embodiment.
Figure 9B:
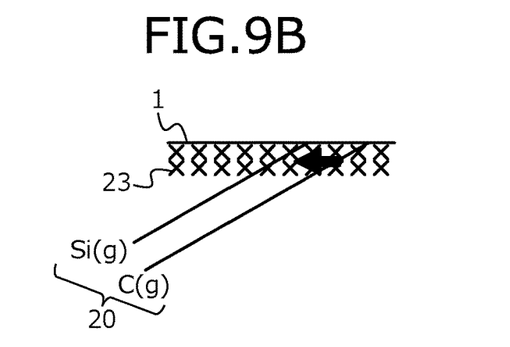
FIG. 9B is a diagram depicting TED conversion in the silicon carbide epitaxial substrate according to the embodiment.
Figure 9C:
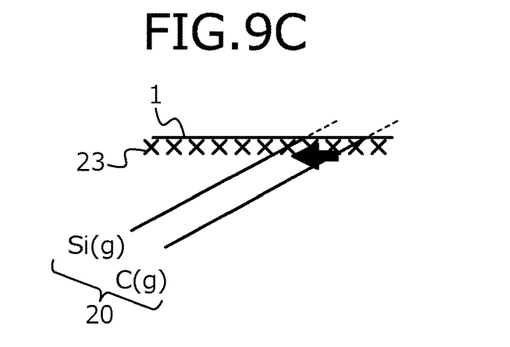
FIG. 9C is a diagram depicting TED conversion in the silicon carbide epitaxial substrate according to the embodiment.
Figure 9D:
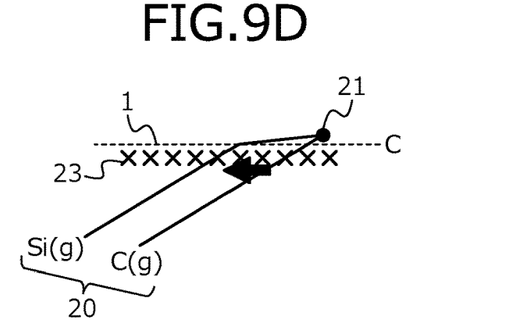
FIG. 9D is a diagram depicting TED conversion in the silicon carbide epitaxial substrate according to the embodiment.

FIGS. 9A, 9B, 9C, and 9D are diagrams depicting TED conversion in the silicon carbide epitaxial substrate according to the embodiment. FIGS. 9A to 9D are cross-sectional views of a silicon carbide epitaxial substrate. As depicted in FIG. 9A, the BPD 20 formed by a narrow stacking fault (hatched portion of FIG. 9A) between two partial dislocations (Si(g)) and (C(g)) is present near a surface of the $n^+$-type silicon carbide substrate 1. Next, as depicted in FIG. 9B, even when thermal stress is applied before the n-type silicon carbide epitaxial layer 2 is epitaxially grown, in the silicon carbide epitaxial substrate according to the embodiment, due to the solid solution strengthening mechanism of the foreign element 23, the partial dislocation Si(g) does not move and therefore, the stacking fault does not expand. Next, as depicted in FIG. 9C, even when the front surface is hydrogen etched in a state of thermal stress being applied, the surface is removed by the hydrogen etching, however, the foreign element 23 is not removed and residual pinning effects continue, whereby crystal defects do not expand. Next, as depicted in FIG. 9D, the n-type silicon carbide epitaxial layer (not depicted) is epitaxially grown. In FIG. 9D, dotted line C indicates the interface between the $n^+$-type silicon carbide substrate 101 and the n-type silicon carbide epitaxial layer. As depicted in FIG. 4D, due to the start of the epitaxial growth, the stacking fault contracts and the BPD 20 is converted into the TED 21.

As described above, the silicon carbide epitaxial substrate of the embodiment has a region having a high density of a foreign element in the $n^+$-type silicon carbide substrate. The foreign element becomes an obstacle when a dislocation moves and hinders the movement of the dislocation and therefore, even when thermal stress is applied, a stacking fault in a BPD does not expand and the BPD is easily converted into a TED, thereby enhancing conversion efficiency of BPDs.

Figure 10:
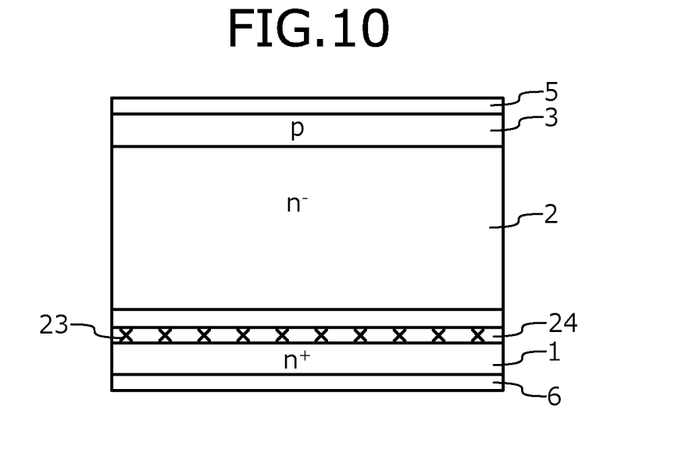
FIG. 10 is a cross-sectional view depicting a structure of a silicon carbide semiconductor device according to the embodiment.

Next, for the silicon carbide semiconductor device using the silicon carbide epitaxial substrate according to the embodiment, a silicon carbide PiN diode will be described as an example. FIG. 10 is a cross-sectional view depicting a structure of a silicon carbide semiconductor device according to the embodiment.

As depicted in FIG. 10, the silicon carbide semiconductor device is configured using a silicon carbide substrate in which, at a front surface of an $n^+$-type silicon carbide substrate (silicon carbide semiconductor substrate of a first conductivity type) 1, an n-type silicon carbide epitaxial layer (first semiconductor layer of the first conductivity type) 2 and a p-type silicon carbide layer (second semiconductor layer of a second conductivity type) 3 are sequentially stacked.

The $n^+$-type silicon carbide substrate 1 is a silicon carbide single crystal substrate doped with, for example, nitrogen, and polytypes of silicon carbide include 3C—SiC, 4H—SiC, 6H—SiC, etc. In the embodiment, the high-density foreign element region 24 is provided in the $n^+$-type silicon carbide substrate 1 and a density of the foreign element 23 thereof at a predetermined depth from the front surface of the $n^+$-type silicon carbide substrate 1 is higher than that of the $n^+$-type silicon carbide substrate 1.

The n-type silicon carbide epitaxial layer 2 is a drift layer that is doped with, for example, nitrogen and has a carrier concentration that is lower than that of the $n^+$-type silicon carbide substrate 1. Further, the p-type silicon carbide layer 3 is provided on the n-type silicon carbide epitaxial layer 2; a cathode electrode 6 is provided at a back surface of the $n^+$-type silicon carbide substrate 1; and an anode electrode 5 is provided at a surface of the p-type silicon carbide layer 3.

Further, a form may be such that a buffer layer that becomes a minority-carrier short-lifetime layer is provided between the $n^+$-type silicon carbide substrate 1 and the n-type silicon carbide epitaxial layer 2. The buffer layer may be a silicon carbide epitaxial layer (hereinafter, high-density nitrogen layer) doped with, for example, nitrogen (N) at a high concentration or may be a silicon carbide epitaxial layer (hereinafter, codoped layer) to which nitrogen and a foreign element such as boron (B), vanadium (V), titanium (Ti), iron (Fe), chromium (Cr), etc. are simultaneously added (codoped). By providing the buffer layer, holes injected by a p-layer recombine in the buffer layer and are prevented from reaching the n$^+$-type silicon carbide substrate 1, enabling an occurrence of stacking faults from the n$^+$-type silicon carbide substrate 1 to be prevented.

Additionally, before the foreign element is further ion implanted, annealing under a constant temperature of 500 degrees C. or higher may be performed to sufficiently contract stacking faults in a BPD. Stacking faults of SiC are known to be temperature unstable and to contract at a temperature of about 500 degrees C. or higher in a state free of external stress and UV irradiation.

(Method of Manufacturing Silicon Carbide Semiconductor Device According to Embodiment)

Figure 11:
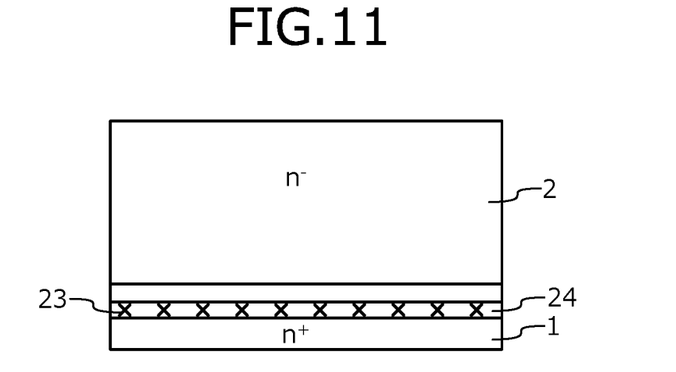
FIG. 11 is a cross-sectional view (part 1) schematically depicting the silicon carbide semiconductor device according to the embodiment during manufacture.
Figure 12:
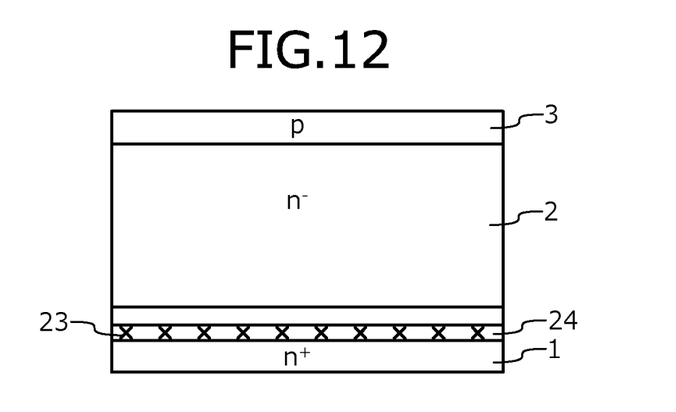
FIG. 12 is a cross-sectional view (part 2) schematically depicting the silicon carbide semiconductor device according to the embodiment during manufacture.

A method of manufacturing the silicon carbide semiconductor device according to the embodiment will be described taking, as an example, a case in which silicon carbide is used as a semiconductor material and PiN diode is fabricated (manufactured). FIGS. 11 and 12 are cross-sectional views depicting states of the silicon carbide semiconductor device according to the embodiment during manufacture.

First, the n$^+$-type silicon carbide substrate 1 is prepared and, as described above, the silicon carbide epitaxial substrate having the high-density foreign element region 24 is manufactured (refer to FIGS. 2 and 3). The state up to here is shown in FIG. 11.

Next, on the n-type silicon carbide epitaxial layer 2, the p-type silicon carbide layer 3 is deposited by epitaxial growth. Here, the p-type silicon carbide layer 3 can also be formed at a surface of the n-type silicon carbide epitaxial layer 2 by ion implantation of a p-type impurity. The state up to here is shown in FIG. 12. Next, activation annealing (heat treatment) for activating diffused regions each formed by ion implantation is performed.

Next, for example, titanium (Ti) and aluminum (Al) are deposited at the surface of the p-type silicon carbide layer 3, whereby the anode electrode 5 is formed. Next, for example, nickel (Ni) is deposited at the back surface of the n$^+$-type silicon carbide substrate 1 and a heat treatment is performed, whereby the cathode electrode 6 is formed. In this manner, a vertical PiN diode depicted in FIG. 10 is completed.

Figure 13:
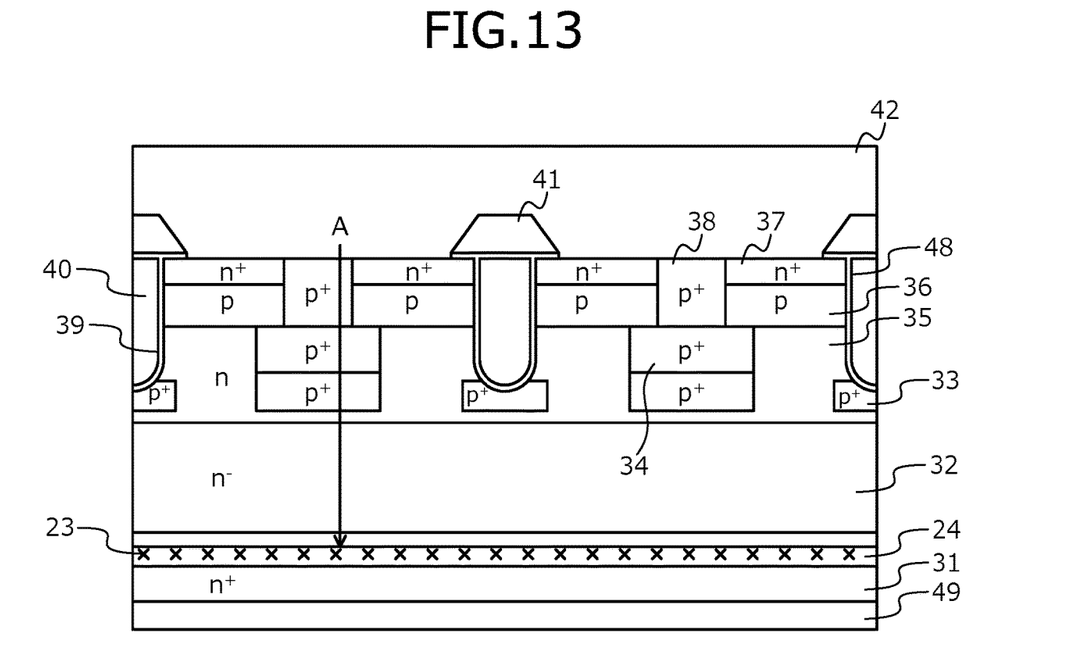
FIG. 13 is a cross-sectional view depicting a structure of a trench-type silicon carbide MOSFET.

In the embodiment described above, while a PiN diode has been described as an example, the present invention is further applicable to built-in diodes of a silicon carbide MOSFET. FIG. 13 is a cross-sectional view depicting a structure of a trench-type silicon carbide MOSFET.

In FIG. 13, reference numerals 31 to 42, 48, 49 are an n$^+$-type silicon carbide substrate, an n$^-$-type drift layer, a first p$^+$-type region, a second p$^+$-type region, an n-type region, a p-type base layer (third semiconductor layer), n$^+$-type source region, a p$^+$-type contact region, a gate insulating film, a gate electrode, an interlayer insulating film, a source electrode (first electrode), and a trench, and a back electrode (second electrode). In the trench-type silicon carbide MOSFET as well, in the n$^+$-type silicon carbide substrate 31, the high-density foreign element region 24 is provided having a density of the foreign element 23 at a predetermined depth from the front surface of the n$^+$-type silicon carbide substrate 1 higher than that of the n$^+$-type silicon carbide substrate 31. Such a vertical MOSFET having a trench gate structure such as this has a built-in diode (parasitic pn diode) that is built therein and formed by the p-type base layer 36 and the n$^-$-type drift layer 32 as a body diode between a source and a drain.

In such a MOSFET, in addition to a mode (synchronous rectification mode) in which current passes through a MOS channel, a mode (bipolar mode) exists in which current passes through the built-in diode like arrow A in FIG. 13. Similarly to the case of a PiN diode, in the bipolar mode, when hole density in the n$^-$-type drift layer 32 exceeds a predetermined value, stacking faults expand due to penetrating BPDs in the n$^-$-type drift layer 32 and the resistance of the n$^-$-type drift layer 32 increases, whereby forward voltage (Vf) degradation occurs.

Therefore, in the embodiment, the silicon carbide epitaxial substrate that has the high-density foreign element region for which the conversion efficiency of BPDs is enhanced is used. Due to this, in the MOSFET as well, similarly to the case of the PiN diode, the occurrence of stacking faults in the n$^+$-type silicon carbide substrate 31 is suppressed and performance degradation can be suppressed.

Furthermore, similarly to the case of the PiN diode, a form may be such that a buffer layer that becomes a minority-carrier short-lifetime layer is provided between the n$^+$-type silicon carbide substrate 31 and the n$^-$-type drift layer 32. The buffer layer may be the high-density nitrogen layer or the codoped layer. By providing the buffer layer, holes injected from a pn interface recombine in the buffer layer and are prevented from reaching the n$^+$-type silicon carbide substrate 31, enabling an occurrence of stacking faults from the n$^+$-type silicon carbide substrate 31 to be prevented.

As described above, a silicon carbide device according to the embodiment uses the silicon carbide epitaxial substrate that has the high-density foreign element region for which the conversion efficiency of BPDs is enhanced, whereby expansion of stacking faults can be suppressed even when high current is applied in a forward direction of the silicon carbide semiconductor device. Therefore, the silicon carbide semiconductor device having high reliability without increases in forward ON voltage can be provided.

In the foregoing, various modifications of the present invention are possible within a range not departing from the spirit of the present invention and in the embodiments described above, for example, dimensions, impurity concentration, etc. of parts are variously set according to required specifications, etc. Further, in the present invention, while in the embodiments, the first conductivity type is set as a p-type and the second conductivity type is set as an n-type, the present invention is similarly implemented when the first conductivity type is set as an n-type and the second conductivity type is set as a p-type.

INDUSTRIAL APPLICABILITY

As described above, the silicon carbide epitaxial substrate, the method of manufacturing a silicon carbide epitaxial substrate, the silicon carbide semiconductor device, and the method of manufacturing a silicon carbide semiconductor device according to the present invention are useful for power semiconductors used in power converting equipment such as inverters, etc. as well as in inverters and the like of electric vehicles and power supply devices of various types of industrial machines and the like.

The invention claimed is:

1. A silicon carbide epitaxial substrate comprising:
   a silicon carbide semiconductor substrate of a first conductivity type;
   a first semiconductor layer of the first conductivity type, provided at a front surface of the silicon carbide semiconductor substrate and having an impurity concentration lower than that of the silicon carbide semiconductor substrate;
   a high-density foreign element region provided in the silicon carbide semiconductor substrate at a predetermined depth from the front surface thereof, the high-density foreign element region containing an element other than carbon and silicon, at a density higher than that of the silicon carbide semiconductor substrate.

2. The silicon carbide epitaxial substrate according to claim 1, wherein
   a thickness of the high-density foreign element region is 0.1 μm to 1.0 μm.

3. The silicon carbide epitaxial substrate according to claim 1 or 2, wherein
   the density of the element in the high-density foreign element region is $1 \times 10^{14}/cm^3$ to $1 \times 10^{18}/cm^3$.

4. The silicon carbide epitaxial substrate according to claim 1, wherein
   the element is hydrogen, magnesium, calcium, scandium, titanium, vanadium, chromium, manganese, or iron.

5. The silicon carbide epitaxial substrate according to claim 1, further comprising a buffer layer that becomes a minority-carrier short-lifetime layer and is provided between the silicon carbide semiconductor substrate and the first semiconductor layer.

6. A silicon carbide semiconductor device comprising:
   a silicon carbide semiconductor substrate of a first conductivity type, having a front surface and a back surface;
   a high-density foreign element region provided in the silicon carbide semiconductor substrate at a predetermined depth from the front surface thereof, the high-density foreign element region containing an element other than carbon and silicon, at a density higher than that of the silicon carbide semiconductor substrate;
   a first semiconductor layer of the first conductivity type, provided at the front surface of the silicon carbide semiconductor substrate and having an impurity concentration lower than that of the silicon carbide semiconductor substrate, the first semiconductor layer having a first surface and a second surface that are opposite to each other, the first surface facing the silicon carbide semiconductor substrate;
   a second semiconductor layer of a second conductivity type, provided at the second surface of the first semiconductor layer;
   a first electrode provided at a surface of the second semiconductor layer; and
   a second electrode provided at the back surface of the silicon carbide semiconductor substrate.

7. A method of manufacturing a silicon carbide epitaxial substrate, the method comprising:
   providing a silicon carbide semiconductor substrate of a first conductivity type;
   ion implanting, to a depth of at least 0.1 μm at a front surface of the silicon carbide semiconductor substrate an element other than carbon and silicon; and
   forming a first semiconductor layer of the first conductivity type, at the front surface of the silicon carbide semiconductor substrate by epitaxial growth, the first semiconductor layer having an impurity concentration lower than that of the silicon carbide semiconductor substrate.

8. The method according to claim 7, wherein
   the element is hydrogen, magnesium, calcium, scandium, titanium, vanadium, chromium, manganese, or iron.

9. A method of manufacturing a silicon carbide semiconductor device, the method comprising:
   providing a silicon carbide semiconductor substrate of a first conductivity type, the silicon carbide semiconductor substrate having a front surface and a back surface;
   irradiating the front surface of the silicon carbide semiconductor substrate with an element other than carbon and silicon to a depth of at least 0.1 μm;
   forming a first semiconductor layer of the first conductivity type, at the front surface of the silicon carbide semiconductor substrate by epitaxial growth, the first semiconductor layer having an impurity concentration lower than that of the silicon carbide semiconductor substrate, the first semiconductor layer having a first surface and a second surface that are opposite to each other, the first surface facing the silicon carbide semiconductor substrate;
   forming a second semiconductor layer of the first conductivity type, at the second surface of the first semiconductor layer, the second semiconductor layer having a first surface and a second surface that are opposite to each other, the first surface of the second semiconductor layer facing the silicon carbide semiconductor substrate;
   forming a third semiconductor layer of a second conductivity type, at the second surface of the second semiconductor layer, the third semiconductor layer having a first surface and a second surface that are opposite to each other, the first surface of the third semiconductor layer facing the silicon carbide semiconductor substrate;
   forming a first electrode at the second surface of the third semiconductor layer; and
   forming a second electrode at the back surface of the silicon carbide semiconductor substrate.

* * * * *